United States Patent [19]

Kakimi

[11] Patent Number: 4,760,011

[45] Date of Patent: Jul. 26, 1988

[54] LIGHT-SENSITIVE MATERIAL CONTAINING SILVER HALIDE, REDUCING AGENT POLYMERIZABLE COMPOUND AND A BASE OR BASE PRECURSOR CONTAINED IN MICROCAPSULES

[75] Inventor: Fujio Kakimi, Minami-ashigara, Japan

[73] Assignee: Fuji Photo Film Co., Ltd., Kanagawa, Japan

[21] Appl. No.: 24,497

[22] Filed: Mar. 11, 1987

[30] Foreign Application Priority Data

Mar. 11, 1986 [JP] Japan .................................. 61-52989

[51] Int. Cl.$^4$ ................................................ G03C 1/72
[52] U.S. Cl. ..................................... 430/138; 430/617
[58] Field of Search ................................. 430/138, 617

[56] References Cited

U.S. PATENT DOCUMENTS

| 4,066,568 | 1/1978 | Nakazawa et al. | 430/138 |
| 4,629,676 | 12/1986 | Hayakawa et al. | 430/203 |
| 4,640,892 | 2/1987 | Kawata et al. | 430/617 |

FOREIGN PATENT DOCUMENTS 0203613  12/1986  European Pat. Off. ............ 430/138

*Primary Examiner*—Paul R. Michl
*Assistant Examiner*—Patrick A. Doody
*Attorney, Agent, or Firm*—Sughrue, Mion, Zinn, Macpeak, and Seas

[57] ABSTRACT

A light-sensitive material comprising a light-sensitive layer provided on a support wherein the light-sensitive layer contains silver halide, a reducing agent, a polymerizable compound and a base or base precursor which is contained in microcapsules under condition that the base or base precursor is dissolved or dispersed in an aqueous solution of a water retention agent.

9 Claims, No Drawings

LIGHT-SENSITIVE MATERIAL CONTAINING SILVER HALIDE, REDUCING AGENT POLYMERIZABLE COMPOUND AND A BASE OR BASE PRECURSOR CONTAINED IN MICROCAPSULES

BACKGROUND OF THE INVENTION

1. Field of the Invention

This invention relates to a light-sensitive material comprising a light-sensitive layer containing silver halide, a reducing agent and a polymerizable compound provided on a support.

2. Description of Prior Arts

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time.

An improved image forming method employing a dry process is described in Japanese Patent Provisional Publication Nos. 61(1986)-69062 and 61(1986)-73145 (the contents of both publications are described in U.S. patent Ser. No. 775,273. In this image forming method, a recording material (i.e., light-sensitive material) comprising a light-sensitive layer containing a light-sensitive silver salt (i.e., silver halide), a reducing agent, a crosslinkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441 (the content of the three publications are shown in U.S. patent Ser. No. 827,702).

The above-mentioned image forming methods are based on the principle in which the polymerizable compound is polymerized in the portion where a latent image of the silver halide has been formed.

Further, Japanese Patent Provisional Publication No. 61(1986)-260241 (corresponding to U.S. patent Ser. No. 854,640) describes another image forming method in which the polymerizable compound in a portion where a latent image of the silver halide has not been formed is polymerized. In this method, when the material is heated, the reducing agent functions as polymerization inhibitor in the portion where a latent image of the silver halide has been formed, and the polmerizable compound in the other portion is polymerized.

SUMMARY OF THE INVENTION

An object of the present invention is to provide a light-sensitive material which is easy in preparation and superior in preservability as well as sensitivity.

Another object of the invention is to provide a light-sensitive material which is advantageously employable in an image forming method including a dry development process and improved in preservability and sensitivity.

There is provided by the present invention a light-sensitive material comprising a light-sensitive layer provided on a support, wherein the light-sensitive layer contains silver halide, polymerizable compound, reducing agent and a base or base precursor which is contained in microcapsules under condition that the base or base precursor is dissolved or dispersed in an aqueous solution of a water retention agent.

The shell of the microcapsule containing the base or base precursor (both of which are hereinafter referred to as "base") is preferably made of a heat melting material (thermoplastic materials) having a melting point or softening point in the range of 50° C. to 200° C. such as a wax or a plastic material such as polyurea resin and/or polyurethane resin.

The base or base precursor having a function of assisting development is incorporated into microcapsules dispersed in the light-sensitive layer of of the light-sensitive material under condition that the base or base precursor is dissolved or dispersed in an aqueous solution of a water retention agent. Therefore, the base or base precursor remains unchanged without agglomeration after a long period of storage before its use, because water is well retained in the microcapsules and hardly evaporates. Accordingly, the high sensitivity of the light-sensitive material of the invention can be mainteined for a long period of time.

In the case that the shell of the microcapsule containing the base is made of a heat melting material having a melting point or softening point in the range of 50° C. to 200° C., the shell of the microcapsule is easily melted or softened during the dry developing process including a heating process so that the base is easily released from the microcapsule to come in contact with the silver halide, polymerizable compound and reducing agent. Therefore, high sensitivity can be obtained by employing a heat melting or heat softening material as a shell material of the microcapsule containing the base or base precursor.

In the invention, the base or base precursor is contained in a microcapsule under the condition of being dissolved or dispersed in an aqueous solution of a water retention agent so that the base is uniformly dispersed in the microcapsule. Accordingly, image forming acceleration can be achieved by a relatively small amount of the base. Further, the stability of the base can be well maintained.

In preparation of the light-sensitive material of the invention, incorporation of the base into a microcapsule can be easily carried out, particularly when the base is water-soluble. While it is difficult to incorporate particles of the base into a microcapsule uniformly, incorporation of an aqueous solution of the base into a microcapsule can be relatively easily carried out. In the case that a volatile liquid such as water is incorporated into a microcapsule, the liquid is apt to evaporate during storage of a long period. Therefore, introduction of a water retention agent into a microcapsule together with water can achieve uniform incorporation of the base into a microcapsule and effective prevention of the base from deposition and agglomeration.

DETAILED DESCRIPTION OF THE INVENTION

The light-sensitive layer of the light-sensitive material according to the invention contains a microcapsule containing the base or base precursor dissolved or dispersed in an aqueous solution of a water retention agent. The base and base precursor have a function of accelerating the oxidation-reduction reaction between the silver halide (and/or organic silver salt), reducing agent and oxidizing reducing agent.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solids content of the light-sensitive layer. These bases or base precursors can be used singly or in combination.

In the invention, the base or base precursor is contained in a microcapsule under condition that the base or base precursor is dissolved or dispersed in an aqueous medium containing a water retention agent.

The water retention agent employable in the invention is a substance showing a high viscosity such as forming a gel upon dissolution or dispersion in water and capable of reducing evaporation of water. Preferred examples include polyol and water soluble polymers.

Examples of the water soluble polymers serving as the water retention agent include various kinds of water soluble polymers having at least one functional group in the molecule such as a hydroxyl group, carboxylic acid group, carboxylic acid salt group and acid amide group. Concrete examples of the water soluble polymers include polyacrylic acid, polyacrylate salt, sodium alginate, carboxymethyl cellulose, salt of carboxymethyl cellulose, polyacrylamide, derivatives of polyacrylamide, polyhydroxymethyl methacrylate, pulluran, acrylic acid copolymer, salt of acrylic acid copolymer, acrylic acid(salt)grafted starch, vinyl alcohol-acrylic acid(salt) copolymer, polyacrylonitrile grafted starch, hydrolyzed methyl acrylate-vinylacetate copolymer, and polyethylene oxide. These polymers may be crosslinked in two or three dimensional directions.

Concrete examples of water soluble polymers and crosslinked substances employable as the water retention agent include Aquakeep 4S (acrylic polymer, water absorption ability: approx. 400 ml/g, produced by Seitetsu Chemical Industries, Co., Ltd.), Aquakeep 10SH (acrylic polymer, water absorption ability: approx. 800–1000 ml/g, produced by Seitetsu Chemical Industries, Co., Ltd.), Sunwet IM-300 (starch grafted with acrylic acid (salt), water absorption ability: approx. 700 ml/g, produced by Sanyo Chemical Industries, Co., Ltd.), Sunwet IM-1000 (starch grafted with acrylic acid(salt), water absorption ability: approx. 1,000 ml/g, produced by Sanyo Chemical Industries, Co., Ltd.), Poids SA-20 (powdery acrylic polymer, water absorption ability: approx. 400 ml/g, produced by Kao Corporation), KI Gel-201K (reaction product of polyvinyl alcohol and cyclic acid anhydride, water absorption ability: approx. 200 ml/g, produced by Kuraray Isoprene Chemical Co., Ltd.), Sumicagel S-50 (vinyl alcohol-acrylic acid polymer, water absorption ability: approx. 500 ml/g, produced by Sumitomo Chemical Industries Co., Ltd.), Sumikagel N-100 (polyacrylic acid soda, water absorption ability: approx. 1,000 ml/g, produced by Sumitomo Chemical Industries Co., Ltd.), Igeta gel (anhydride of methylacrylate-vinylacetate copolymer, water absorption ability: approx. 500 ml/g, produced by Sumitomo Chemical Industries, Co., Ltd.), Jelfine (carboxymethyl cellulose, water absorption ability: approx. 200 ml/g, produced by Dicel Chemical Industires Co., Ltd.), OKS-7702 (polyvinyl alcohol-maleate copolymer, water absorption ability: approx. 250 ml/g, produced by Nippon Gosei Chemical Industires Co., Ltd.), OKS-7703 (polyvinyl alcohol-maleate copolymer, water absorption ability: approx. 270 ml/g, produced by Nippon Gosei Chemical Industires Co., Ltd.), Aqualon C (carboxymethyl cellulose in the form of linters, water absorption ability: approx. 35–45 ml/g, produced by Hercules Co., Ltd.), Ranseal (acryl fiber, water absorption ability: approx. 600 ml/g, Nippon Exlan Industries, Co., Ltd.), Ranseal F (acryl fiber, water absorption ability: approx. 150 ml/g, Nippon Exlan Industries, Co., Ltd.), SGP water absorbing polymer (starch derivative, water absorption ability: 1,000–1,200 ml/g, produced by Henkel Corp.), PE08 (polyethylene oxide, produced by Seitetsu Chemical Industries, Co., Ltd.), Carboball 934, 940, 941 (carboxyvinyl polymers, produced by B. F. Goodrich), Primal ASE-60, ASE-75, RM-5, QR-708 (acrylic emulsion, produced by Rohm & Haas), Acrysol GS (aqueous acrylic solution, produced by Rohm & Haas) and Disparon #6900-10X (aqueous polyamide solution, produced by Kusumoto Kasei Co., Ltd.).

Polyols such as glycerol, diethylene glycol, triethylene glycol and propylene glycol may be employed as the water retention agents in the invention.

Polymers having high water absorption properties and employable as the water retention agent are described in "Fiber and Industries" vol. 38 No. 10, 459–465 (1982), edited by Fiber Society.

The water retention agent and base (base or base precursor) can be dissolved or dispersed in water in a conventional manner. There is no specific limitation with respect to the amount of the retention agent used in the invention. The amount may be determined depending on the water absorption ability thereof. The water retention agent preferably is contained in the microcapsule in the amount of from 0.1 weight % to 30 weight % of the microcapsule.

The aqueous medium employed in the invention usually consists essentially of water. However, the aqueous medium may contain a water-miscible organic solvent such as alcohol, ketone and ester.

The shell of the microcapsule containing an aqueous solution which contains the water retention agent and base or base precursor can be prepared by conventional methods using polyurea resin, polyurethane resin, polyamide resin, polyester resin, epoxy resin, aminoaldehyde resin, gelatin and a mixture of these polymers.

However, in order to improve easiness in releasing the base or base precursor during the developing process as well as preservability thereof, the shell of the microcapsule is preferably made of a heat melting or heat softening material having a melting point or softening point in the range of 50° C. to 200° C. Preferred examples of the heat-melting material include a wax. Known waxes such as a natural wax, petroleum wax and sythetic wax may be employed as the shell material of the microcapsule containing the base or base precursor in the light-sensitive material of the invention.

Examples of waxes employable as a shell material of the microcapsule containing the base or base precursor in the light-sensitive material of the invention are shown as follows:

(1) natural wax: vegetable wax (e.g., carnauba wax, rice wax and Japan wax), animal wax (e.g., beeswax, lanolin, spermaceti), mineral wax (e.g., montan wax, ozokerite, ceresin wax);

(2) petroleum wax: paraffin wax, microcrystalline wax;

(3) synthetic wax: petroleum synthetic wax, polyethylene wax, Fischer-Tropsch wax, synthetic fatty wax (e.g., cured castor oil, aliphatic amide, ketone, amine, imide, esters).

The microcapsule containing the aqueous solution which contains the water retention agent and the base or base precursor can be prepared by forming the shell of the microcapsule around the micro-droplet of the aqueous solution by conventional methods.

The microcapsule containing the base or base precursor may further contain a hot-melt solvent.

The term "hot-melt solvent" in the specification means that a solvent which is solid at a room temperature and melts at a certain temperature during the heat development process to function as a solvent of the base. Examples of the hot-melt solvents preferably employable in the invention include compounds belonging to urea, urethane, amide, pyrizine, sulfonamide, sulfon, sulfoxide, ester, ketone and ether, having a melting point of not lower than 40° C.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26–28 (December 1976). The hot-melt solvent is preferably used in an amount of from 0.5 to 50% by weight, and more preferably from 1 to 20% by weight, based on the total solid content of the light-sensitive layer.

The silver halide, the reducing agent, the polymerizable compound and the support which constitute the light-sensitive material of the invention are described below. Thus composed material is referred herein to as "light-sensitive material".

There is no specific limitation with respect to silver halide contained in the light-sensitive layer of the light-sensitive material.

Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent Application No. 100,984) can be employed.

There is no specific limitation on the crystal habit of silver halide grains. Two or more kinds of the silver halide grains which differ in halogen composition, crystal habit, grain size, and/or other features from each other can be used in combination. There is no specific limitation on grain size distribution of silver halide grains. The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either an area where a latent image of the silver halide has been formed or an area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441. These reducing agents are also described in T. James, "The Theory of the Photographic Process", 4th edition, 291-334 (1977), Research Disclosure No. 17029, 9-15 (June 1978), and Research Disclosure No. 17643, 22-31 (December 1978). The reducing agents described in the these publications and applications can be employed in the light-sensitive material of the present invention. Thus, "the reducing agent(s)" in the present specification means to include all of the reducing agents described in the above mentioned publications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material of the invention are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material of the invention can be prepared by arranging a light-sensitive layer containing the above-mentioned components such as a silver halide, polymerizable compound, reducing agent and a microcapsule containing the base or base precursor and optional components on a support.

There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

The oil droplets of the polymerizable compound are preferably prepared in the form of microcapsules.

It is preferred that the silver halide, polymerizable compound and reducing agent (and a color forming substance, optional component) are contained together in a microcapsule dispersed in the light-sensitive material and that the base or base precursor is contained in another microcapsule.

There is no specific limitation on preparation of the microcapsules. There is also no specific limitation on shell material of the microcapsule, and various known materials such as polymers which are employed in the conventional microcapsules can be employed as the shell material. The mean size of the microcapsule preferably ranges from 0.5 to 50 μm, more preferably 1 to 25 μm, most preferably 3 to 20 μm.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect. The light-sensitive material employing an organic silver salt is described in Japanese Patent Application No. 60(1985)-141799 (corresponding to U.S. Pat. Ser. No. 879,747).

Various image formation accelerators are employable in the light-sensitive material of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

Examples of the antifogging agent include 5- or 6-membered nitrogen-containing hetero cyclic compounds (including compounds having cyclic amide structure), thiourea derivative, thioether compound and thiol derivative, which are known in the conventional art of photography.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclo hexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. The light-sensitive material employing the thermal polymerization initiators is described in Japanese Patent Provisional Publication No. 61(1986)-260241 (corresponding to U.S. Ser. No. 854,640).

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles such as particles of talc, kaolin, bentonite, agalmatolite, zinc oxide, titanium dioxide or alumina described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. A light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer. The details of the image-receiving layer will be described later.

Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halide salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halide salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivative; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material, can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of maintaining the dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

Instead of employing the above polymer, the light-sensitive composition can be prepared by dispersing the microcapsules having the silver halide emulsion as core material in the emulsion of the polymerizable compound.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

The preparation of the microcapsule containing the base or base precursor has been mentioned above. The prepared microcapsule can be added to the coating solution at an optional stage.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. The original image can be either a monochromatic image or color image.

Development of the light-sensitive material can be conducted simultaneously with or after the imagewise exposure. The development can be conducted using a developing solution in the same manner as the image forming method described in Japanese Patent Publication No. 45(1979)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerization compound in a portion where a latent image of the silver halide has been formed or in a portion where a latent image of the silver halide has not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Provisional Publication No. 61(1986)-260241 (corresponding to U.S. patent Ser. No. 854,640).

In the above development process, a polymer image can be formed on the light-sensitive layer. A pigment image can be also obtained by fixing pigments to the polymer image.

The image can be also formed on the image-receiving material. The image-receiving material is described hereinbelow. The image forming method employing the image-receiving material or the image-receiving layer is described in Japanese Patent Provisional Publication No. 61(1986)-278849 (corresponding to U.S. patent Ser. No. 868,385).

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer.

The image-receiving layer can be composed of two or more layers according to the above-mentioned functions. The thickness of the image-receiving layer preferably ranges from 1 to 100 μm, more preferably from 1 to 20 μm.

After the development process, pressing the light-sensitive material in contact with the image-receiving material to transfer the polymerizable compounds which is still polymerizable to the image-receiving material, a polymr image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 3,000 ml of water were dissolved 40 g of gelatin and 23.8 g of sodium bromide, and the resulting gelatin solution was kept at 50° C. To the gelatin solution, 200 ml of an aqueous solution containing 34 g of silver nitrate was added under stirring for 10 minutes. Subsequently, to the mixture 100 ml of an aqueous solution containing 3.3 g of sodium iodide was added for 2 min. Excess salts were sedimented and removed from the resulting emulsion by pH-adjustment. Thereafter, the emulsion was adjusted to a pH of 6.0 to obtain a silver bromoiodide emulsion. The yield of the emulsion was 400 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution containing 17 g of silver nitrate for 2 minutes. Excess salts were sedimented and removed from the resulting emulsion by pH-adjustment. Thereafter, the emulsion was adjusted to a pH of 6.30 to obtain a silver benzotriazole emulsion. The yield of the emulsion was 400 g.

Preparation of light-sensitive composition

In 100 g of trimethylolpropane triacrylate were dissolved 0.40 g of the following copolymer, 6.00 g of Pargascript Red I-6-B (product, Chiba-Geigy). To 18.00 g of the resulting solution was added a solution in which 0.61 g of the following hydrazine derivative and 1.22 g of the following developing agent are dissolved in 1.8 g of methylene chloride. Further, to the resulting solution was added a mixture consisting of 4.06 g of the silver halide emulsion and 3.35 g of the silver benzotriazole emulsion, and the mixture was stirred at 15,000 r.p.m. for 5 min. to obtain a light-sensitive composition.

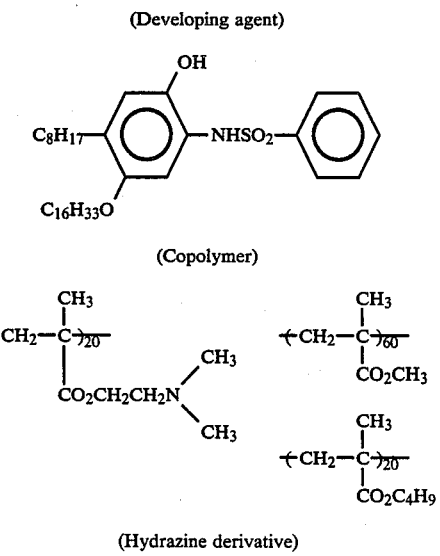

(Developing agent)

(Copolymer)

(Hydrazine derivative)

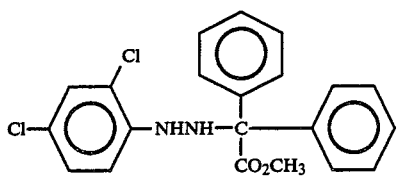

Preparation of light-sensitive microcapsule

To 10.51 g of 18.6% aqueous solution of Isobam (tradename, produced by Kuraray Co., Ltd.) was added 48.56 g of 2.89% aqueous solution of pectin. After the solution was adjusted to a pH of 4.0 using 10% sulfuric acid, the above light-sensitive composition was added to the solution, and the mixture was stirred at 7,000 r.p.m. for 2 min. by means of homogenizer to emulsify the light-sensitive composition in the aqueous medium.

To 72.5 g of the aqueous emulsion were added 8.32 g of 40% aqueous solution of urea, 2.82 g of 11.3% aqueous soluion of resorcinol, 8.56 g of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.2 using 10% aqueous solution of sodium hydroxide, 3.62 g of 30.9% aqueous solution of sodium hyrogen sulfite was added to the mixture to obtain a dispersion containing light-sensitive microcapsules.

Preparation of microcapsules containing the base

In 10 g of paraffin (mp: 69° C.) melted by heating to 75° C. was dissolved 0.7 g of sorbitan trioleate. To the mixture was added a solution consisting of 5 g of 30% aqueous solution of 1,4-diazabicyclo[2.2.2]octane (DABCO) and 1 g of glycerol (water retention agent) and the resulting mixture was stirred at 15,000 rpm for 5 min. to emulsify. Subsequently, the emulsion heated at 75° C. was added again to 40 g of 5% aqueous solution of polyvinyl alcohol heated at 75° C. and stirred at 5,000 rpm for 2 min. by using a homogenizer. Thereafter, the emulsion was stirred at 3,000 rpm as the homogenizer was cooled, so as to obtain a dispersion of microcapsules in which the base (DABCO) dissolved in an aqueous solution of glycerine was enclosed in a shell made of paraffin.

Preparation of light-sensitive sheet

The above dispersion of microcapsules containing the base was coated on a polyethylene terephthalate film (support, thickness: 100 μm) using a coating rod of #40 to give a layer having an amount of 14 g/m$^2$ based on the dry weight and dried at a room temperature for 1 hour to obtain a base-containing microcapsule sheet. Subsequently, the above light-sensitive microcapsule dispersion was coated on the base-containing microcapsule layer of the sheet using a coating rod of #4 to give a layer having an amount of 7 g/m$^2$ based on the dry weight and dried at 40° C. for 1 hour to obtain a light-sensitive sheet.

EXAMPLE 2

A dispersion of microcapsules containing the base and water retention agent was prepared in the same manner as in Example 1 except that 1 g of polyethylene glycol was used as water retention agent in place of glycerol.

The above dispersion of microcapsules containing the base was coated on a polyethyleneterephthalate film (support, thickness: 100 μm) using a coating rod of #40 to give a layer having an amount of 14 g/m$^2$ based on the dry weight and dried at a room temperature for 1 hour to obtain a base-containing microcapsule sheet. Subsequently, the same light-sensitive microcapsule dispersion as that used in Example 1 was coated on the base-containing microcapsule layer of the sheet using a coating rod of #40 to give a layer having an amount of 7 g/m$^2$ based on the dry weight and dried at 40° C. for 1 hour to obtain a light-sensitive sheet.

COMPARISON EXAMPLE 1

A dispersion of microcapsules containing the base was prepared in the same manner as in Example 1 except that no water retention agent was used.

The above dispersion of microcapsules containing the base was coated on a polyethyleneterephthalate film (support, thickness: 100 μm) using a coating rod of #40 to give a layer having an amount of 14 g/m$^2$ based on the dry weight and dried at a room temperature for 1 hour to obtain a base-containing microcapsule sheet. Subsequently, the same light-sensitive microcapsule dispersion as that used in Example 1 was coated on the base-containing microcapsule layer of the sheet using a coating rod of #4 to give a layer having an amount of 14 g/m$^2$ based on the dry weight and dried at 40° C. for 1 hour to obtain a light-sensitive sheet.

Evaluation of light-sensitive materials

Each of the light-sensitive sheets was stored for 1 week at a temperature of 50° C. under humidity of 40%RH.

Subsequently, each of the sheets was exposed to light of 2000 lux for 1 second and then developed by bringing the sheets into contact with a drum at 125° C. for 50 seconds. Thereafter, each of the sheets was combined with a developer sheet (a sheet coated with a zinc salt of salicyclic acid derivative) and passed through press rolls under pressure of 450 kg/cm$^2$ to make the sheets form a color.

The light-sensitive sheets prepared in Examples 1 and 2 showed excellent color formation while the light-sensitive sheet prepared in Comparison Example 1 showed inferior color formation.

I claim:

1. A light-sensitive material comprising a light-sensitive layer provided on a support wherein the light-sensitive layer contains silver halide, an ethylenic unsaturated polymerizable compound, a reducing agent, and a base or base precursor which is contained in microcapsules under the condition that the base or base precursor is dissolved or dispersed in an aqueous solution of a water retention agent.

2. The light-sensitive material as claimed in claim 1, wherein the silver halide, the ethylenic unsaturated polymerizable compound and the reducing agent are contained together in microcapsules which are dispersed in the light-sensitive layer, and the base or base precursor is contained in microcapsules different from the above microcapsules.

3. The light-sensitive material as claimed in claim 1, wherein the base or base precursor is dissolved in an aqueous solution of the water retention agent.

4. The light-sensitive material as claimed in claim 1, wherein the water retention agent is a water soluble polymer having a functional group in the molecule which is selected from the group consisting of hydroxyl group, carboxylic acid group, carboxylate group and acid amide group.

5. The light-sensitive material as claimed in claim 1, wherein the water retention agent is a polyol selected from the group consisting of glycerol, diethylene glycol, triethylene glycol and propylene glycol.

6. The light-sensitive material as claimed in claim 1, wherein the shells of the microcapsules containing the base or base precursor comprise a thermoplastic material having a melting point or softening point in the range of 50° C. to 200° C.

7. The light-sensitive material as claimed in claim 1, wherein the shells of the microcapsules containing the base or base precursor comprise a wax.

8. The light-sensitive material as claimed in claim 1, wherein the shells of the microcapsules containing the base or base precursor comprise polyurea and/or polyurethane resin.

9. The light-sensitive material as claimed in claim 1, wherein the light-sensitive layer contains a color image forming substance.

* * * * *